United States Patent
Kasahara et al.

(10) Patent No.: US 7,790,987 B2
(45) Date of Patent: Sep. 7, 2010

(54) METHODS AND APPARATUS FOR INTERCONNECTING A BALL GRID ARRAY TO A PRINTED CIRCUIT BOARD

(75) Inventors: Eiji Kasahara, Austin, TX (US); Hiroshi Katoh, Austin, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 28 days.

(21) Appl. No.: 11/116,066

(22) Filed: Apr. 27, 2005

(65) Prior Publication Data

US 2006/0243480 A1 Nov. 2, 2006

(51) Int. Cl.
*H05K 1/16* (2006.01)

(52) U.S. Cl. ..................................... 174/260

(58) Field of Classification Search ............... 174/260, 174/261, 267; 361/760, 776; 439/66, 91; 257/773
See application file for complete search history.

(56) References Cited

U.S. PATENT DOCUMENTS

| | | | |
|---|---|---|---|
| 3,364,807 A * | 1/1968 | Holton | 411/436 |
| 5,017,738 A * | 5/1991 | Tsuji et al. | 174/94 R |
| 6,007,349 A * | 12/1999 | Distefano et al. | 439/71 |
| 6,193,524 B1 * | 2/2001 | Chang | 439/66 |
| 6,422,879 B2 * | 7/2002 | Fujimura | 439/91 |
| 6,464,511 B1 * | 10/2002 | Watanabe et al. | 439/66 |
| 6,672,881 B2 * | 1/2004 | Evans | 439/71 |
| 6,717,421 B1 * | 4/2004 | Kazama | 324/754 |
| 6,843,658 B2 * | 1/2005 | Kuwabara et al. | 439/66 |
| 6,846,184 B2 * | 1/2005 | Fan et al. | 439/66 |
| 7,014,437 B2 * | 3/2006 | Ohsumimoto et al. | 418/201.1 |
| 2003/0090000 A1 * | 5/2003 | Caletka et al. | 257/781 |
| 2003/0124895 A1 * | 7/2003 | Winter et al. | 439/219 |
| 2004/0192080 A1 * | 9/2004 | Li | 439/66 |
| 2004/0223309 A1 * | 11/2004 | Haemer et al. | 361/767 |
| 2005/0009381 A1 * | 1/2005 | Fan et al. | 439/66 |
| 2007/0228926 A1 * | 10/2007 | Teo et al. | 313/495 |

* cited by examiner

*Primary Examiner*—Jinhee J Lee
*Assistant Examiner*—Abiy Getachew
(74) *Attorney, Agent, or Firm*—Matthew B. Dernier, Esq.; Gibson & Dernier LLP

(57) ABSTRACT

Methods and apparatus provide for connecting an integrated circuit having a ball grid array to a printed circuit board having a matrix of contact pads for electrical connection to the ball grid array.

29 Claims, 7 Drawing Sheets

METHODS AND APPARATUS FOR INTERCONNECTING A BALL GRID ARRAY TO A PRINTED CIRCUIT BOARD

BACKGROUND

The present invention relates to the electrical connection of integrated circuits to printed circuit boards, and in particular, to methods and apparatus for interconnecting a ball grid array of an integrated circuit to matching pads of a printed circuit board.

It is a challenging process to interconnect chip packages containing VLSI (very large scale integrated) circuits having large I/O pin counts to an underlying printed circuit board (PCB). Conventional interconnection techniques include pin grid arrays (PGAs) and ball grid arrays (BGAs). BGAs may accommodate more connections in a miniature package. They also cause less distortion of signals, at least partly because they have lower thermal resistances. Many such chip packages employ ball grid arrays (BGAs) to achieve VLSI-to-PCB interconnections. Among the problems with interconnecting ball grid arrays to a PCB include excessive resistance and inductance of the interconnection material as well as differences in thermal expansion and other mechanical stress related issues.

Reference is now made to FIGS. 1-2, which illustrate prior art techniques of coupling a VLSI circuit 10 to a PCB 20 using a BGA. There are two conventional methods for interconnecting the balls pads 12 of the ball grid array to the aligned contact pads 14 of the printed circuit board 20. As shown in FIG. 1, one technique employs solder 16 to couple the ball pads 12 to the contact pads. Assuming that the ball pads 12 are made of solder, such ball pads 12 are partly melted and then cooled and solidified to form an electrical connection. However, the soldering process is complex and costly. Moreover, any bending and/or thermal expansion of the PCB 20 is transmitted directly to the VLSI circuit package 10. This may cause the solder joints 14 to fracture due to thermal and/or mechanical stress. The thermal stress may result from a difference in the coefficient of thermal expansion between the solder 16, the contact pads 14 (which may be formed from gold or copper), and the materials forming the PCB 20 and/or the chip package 10.

As shown in FIG. 2, the other technique employs coil springs 18 to interconnect the ball pads 12 to the contact pads 14. The coil springs 18 are sandwiched between the ball pads 12 and the contact pads 14, thereby compressing the springs 18. A clamping system 22 couples the chip package 10 to the PCB 20 such that the ball pads 12, the coil springs 18, and the contact pads 14 are in registration. The springs 18 are in compression and bias against the ball pads 12 and the contact pads 14, thereby establishing the electrical interconnection. Compared to the soldering method, the coil springs 18 may be easier and cheaper to implement. They may also be less susceptible to thermal and/or mechanical stress. However, each coil spring 18 has considerable electrical resistance (which is proportional to its length and inversely proportional to its cross-section area). Further, each coil spring 18 exhibits undesirable electrical resistance inductance (which is proportional to the number of turns thereof). Still further, each coil spring 18 exhibits undesirable electrical capacitance (formed between adjacent turns of the spring). The resistance, inductance and capacitance introduced by the coil springs 18 may significantly and undesirably affect the signal response through the interconnection, particularly at high frequencies.

Therefore, there is a need in the art for an new interconnection solution to couple a ball grid array of an integrated circuit to a matching matrix of pads on a printed circuit board, which has improved electrical characteristics and a better mechanical performance.

SUMMARY OF THE INVENTION

In accordance with one or more embodiments of the present invention, a coaxial spring is employed to interconnect the ball pads of a VLSI package to the contact pads of a PCB. The coaxial spring collapses upon itself when a compressive force is applied. Each ball of the BGA preferably employs such a spring to interconnect with the PCB. When the springs are compressed, they exhibit relatively low resistance and inductance as compared to standard coil spring technology.

In accordance with one or more further embodiments of the present invention, carbon nanotubes are employed to interconnect the ball grid array to the PCB. Carbon nanotubes are tubular carbon molecules with properties that make them useful in the extremely small scale application of interconnecting a BGA to a PCB. They exhibit unusual strength and unique electrical properties, and are extremely efficient conductors of heat. A nanotube has a structure similar to a fullerene, but where a fullerene's carbon atoms form a sphere, a nanotube is cylindrical and each end is typically capped with half a fullerene molecule. The carbon nanotubes are preferably formed into cylinders of appropriate dimensions to fit between each of the balls of the BGA and the respective pads on the PCB. In one embodiment, a sheet of non-conductive material may act as a holder of many separate carbon nanotube cylinders at a suitable pitch to match the BGA/PCB configuration.

In accordance with one or more embodiments of the present invention, an apparatus includes: an integrated circuit having a ball grid array; a printed circuit board having a matrix of contact pads in registration with the ball grid array; and a plurality of coaxial springs each having a first end in electrical contact with a ball pad of the ball grid array and a second end in electrical contact with a corresponding one of the contact pads, wherein the coaxial spring is in the shape of a conical helix such that turns thereof tend to coaxially align when a compressive force is applied.

The turns of each of the springs preferably have larger diameters at one of the first and second ends than those at the other of the first and second ends. For example, adjacent turns of each spring may be in contact with one another substantially along their entire lengths.

Preferably, each spring is formed of a length material having a ribbon shape. For example, each spring has a longitudinal axis, and the length of material has a cross-section in which a height thereof, in a direction parallel to the longitudinal axis, is greater that a width thereof, in a direction perpendicular to the longitudinal axis. Preferably, peripheral sides of adjacent turns of each spring are in contact with, and at least partially overlap, one another. In a preferred embodiment, each spring is in a substantially collapsed position such that the peripheral sides of adjacent turns substantially overlap one another. In another preferred embodiment, the spring is telescopic.

A clamp operable may be used to maintain the integrated circuit coupled to the printed circuit board such that each spring is compressed. Further, conductive paste may be used to couple at least one end of each spring to the corresponding ball pad or contact pad.

In accordance with one or more further embodiments of the present invention, an apparatus includes: an integrated circuit having a ball grid array; a printed circuit board having a matrix of contact pads in registration with the ball grid array; and a plurality of connection elements formed from carbon nanotubes, each connection element having a first end in electrical contact with a ball pad of the ball grid array and a second end in electrical contact with a corresponding one of the contact pads.

Preferably, at least one of the first end and the second end of each the connection elements are connected to the ball pad and/or the contact pad by means of conductive paste. A clamp may be used to maintain the integrated circuit coupled to the printed circuit board such that each connection element is in compression.

In a preferred embodiment, an orientation sheet of a non-conductive material may include a plurality of apertures for receiving the connection elements and maintaining same in a predetermined position and in registration with the ball pads and the contact pads.

It is most preferred that the connection elements are in the form of a cylinder.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the embodiments of the invention, there are shown in the drawings forms that are presently preferred, it being understood, however, that the embodiments of the invention are not limited to the precise arrangements and instrumentalities shown.

DETAILED DESCRIPTION OF THE PREFERRED EMBODIMENTS

Figure 1:
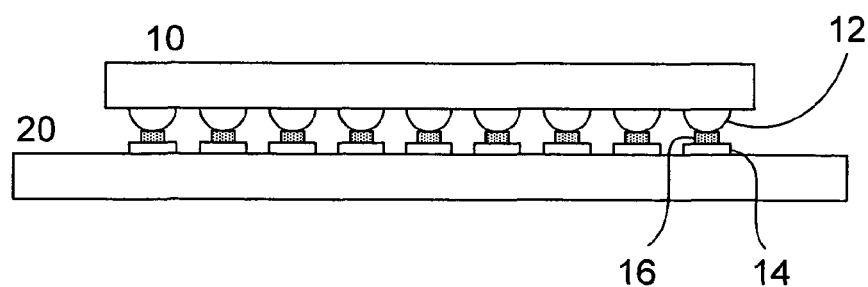
FIG. 1 is a side view of a conventional apparatus for interconnecting a ball grid array to a PCB.
Figure 2:
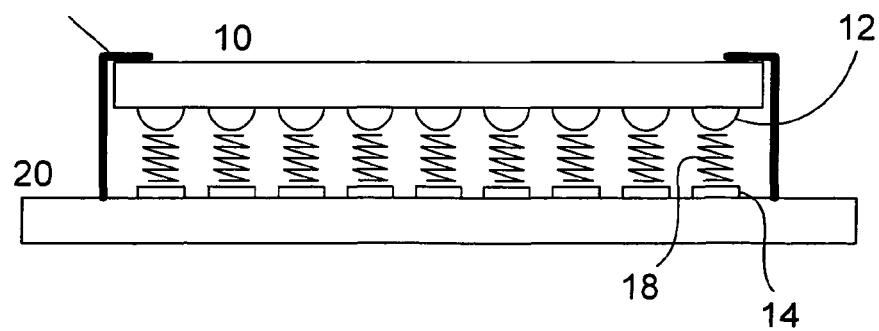
FIG. 2 is a side view of another conventional apparatus for interconnecting a ball grid array to a PCB.
Figure 3:
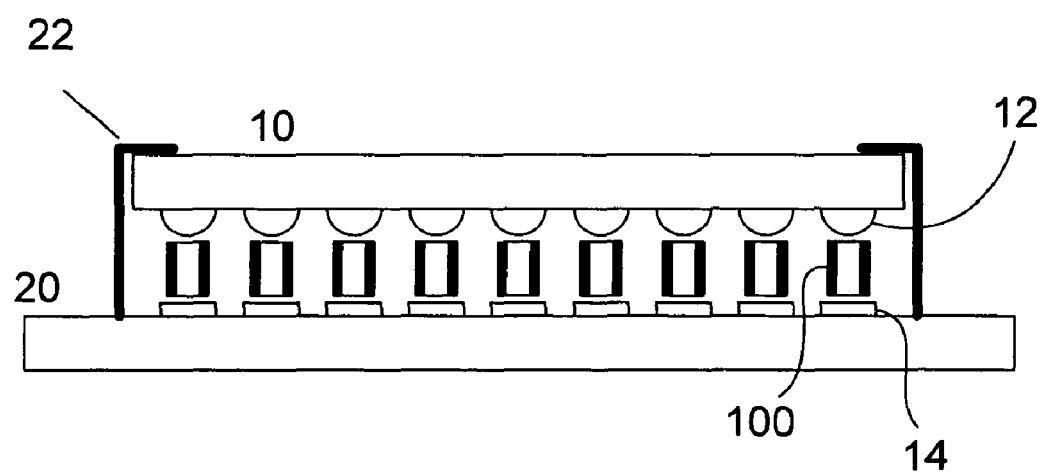
FIG. 3 is a side view of an apparatus for interconnecting a ball grid array to a PCB using coaxial springs in accordance with one or more embodiments of the present invention.

Reference is now made to FIG. 3, which is a side view of an apparatus that is suitable for interconnecting an integrated circuit package 10 with a printed circuit board 20 in accordance with one or more aspects of the present invention. The package 10 includes a ball grid array including a plurality of ball pads 12 in registration with a matrix of contact pads 14 on the PCB 20. The apparatus includes a plurality of coaxial springs 100 providing electrical interconnection between respective ball pads 12 of the ball grid array and corresponding contact pads 14 of the PCB 20. The coaxial springs 100 are preferably maintained in compression by way of clamps 22.

Figure 4:
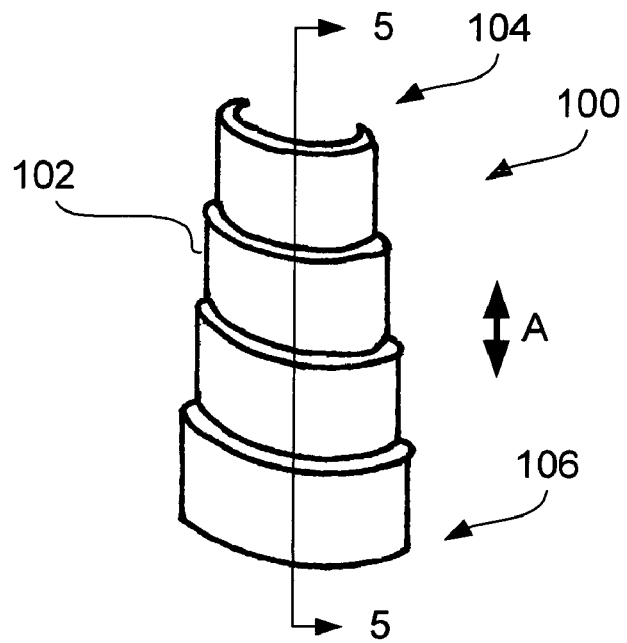
FIG. 4 is an elevational view of a coaxial spring that may be used for interconnecting a ball grid array to a PCB as illustrated in FIG. 3.
Figure 5:
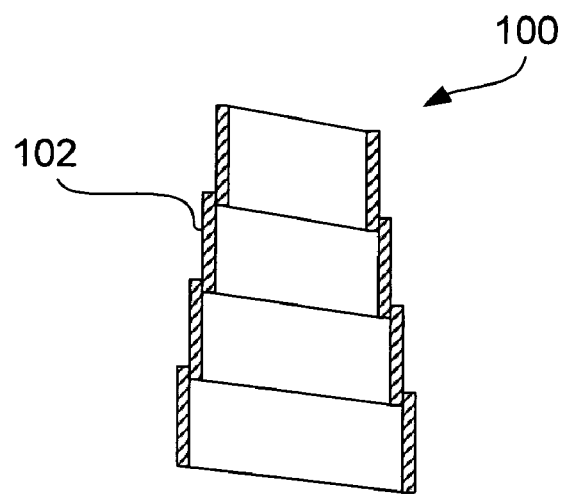
FIG. 5 is a sectional view of the coaxial spring of FIG. 4 taken through line 5-5.

Reference is now made to FIG. 4, which is a side elevational view of a coaxial spring 100 that may be used for interconnecting the ball grid array to the PCB 20 as illustrated in FIG. 3. FIG. 5 is a sectional view of the coaxial spring 100 taken through line 5-5 of FIG. 4. The coaxial spring 100 is preferably in the shape of a conical helix such that the turns thereof tend to coaxially align when a compressive force is applied to the spring 100. In other words, the turns 102 of the spring 100 have larger diameters at the second end 106 as compared to the first end 104. Further, adjacent turns 102 of the spring 100 are preferably in contact with one another substantially along the entire lengths thereof.

In a preferred embodiment, each spring 100 is preferably formed of a length of material having a ribbon shape. Thus, assuming each spring has a longitudinal axis (such as in alignment with line 5-5), the length of material has a cross-section in which a height thereof (which is in a direction parallel to the longitudinal axis) is greater than a width thereof (where the width is in a direction perpendicular to the longitudinal axis).

Figure 6:
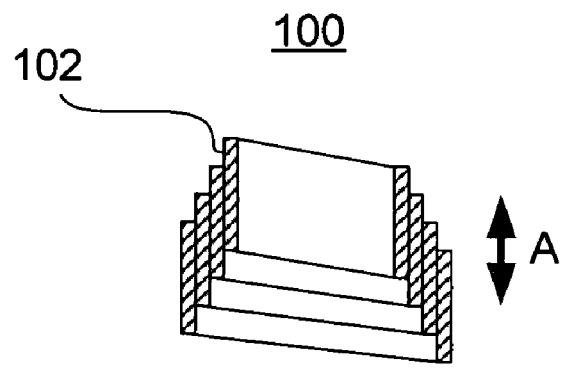
FIG. 6 is a sectional view of the coaxial spring of FIG. 4 taken through line 5-5, where the spring is at least partially compressed.
Figure 7:
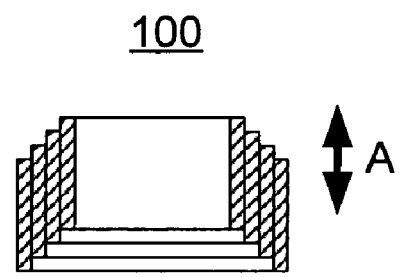
FIG. 7 is a sectional view of the coaxial spring of FIG. 4 taken through line 5-5, where the spring is further compressed.
Figure 8:
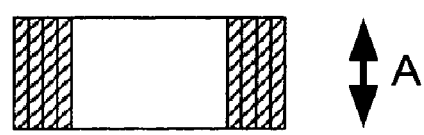
FIG. 8 is a sectional view of the coaxial spring of FIG. 4 taken through line 5-5, where the spring is fully compressed.

As best seen in FIG. 5, the peripheral sides of adjacent turns 102 are in contact with, and at least partially overlap, one another. Such overlap may be to a higher or lower degree depending on the compressive force applied to the spring 100. For example, in FIG. 6, the amount of compressive force is increased such that the amount of overlap is significantly greater than that shown in FIG. 5. The bi-directional arrow A indicates a biasing force provided by the coaxial spring 100 when in some level of compression. FIG. 7 illustrates the coaxial spring 100 in a further compressed state, while FIG. 8 shows the coaxial spring 100 in a fully compressed configuration.

As shown in FOG 8, when the spring 100 is sandwiched between the ball pads 12 and the contact pad 14 under compressive force, the spring 100 may substantially completely collapse, or at least partly collapse (FIG. 7), depending on a desired distance between the integrated circuit 10 and the printed circuit board 20. With the adjacent turns 102 completely or partially overlapping and contact each other, the resistance is substantially decreased. Especially in the embodiment shown in FIG. 8, the completely collapsed spring 100 forms a substantially solid conductive rod (except for a small central through hole left by the innermost turn 102). This results in very low resistance, inductance and capacitance. Because the adjacent turns 102 of the spring 100 overlap each other, very little inductance and capacitance can be formed between the turns. This results in excellent electrical characteristics as a connection solution between the ball grid array and the pad matrix.

Figure 9:
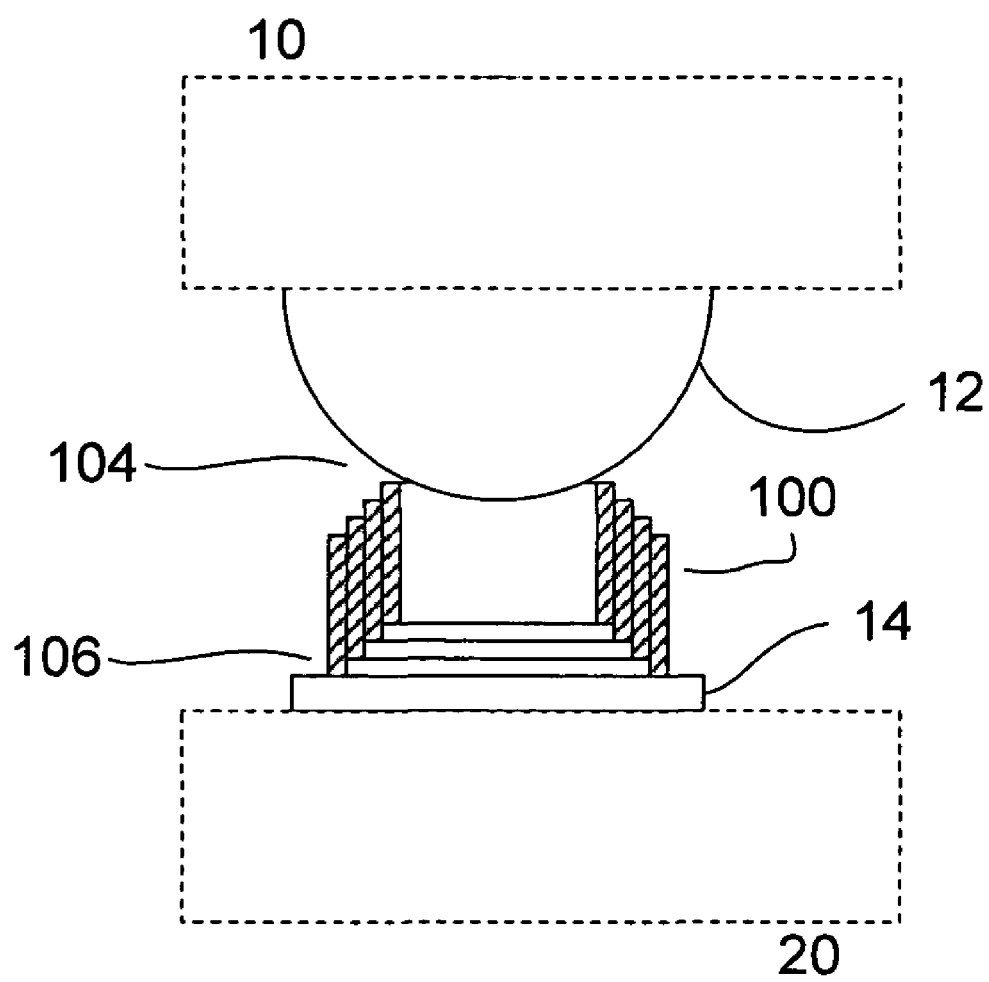
FIG. 9 is a partial side view of the apparatus of FIG. 3 where the spring is partially compressed.

Reference is now made to FIG. 9, which is a partial side view of the apparatus of FIG. 3, where the spring 100 is at least partially compressed. In this configuration, the first end 104 of the spring 100 is in electrical contact with a ball pad 12 of the ball grid array, while the second end 106 of the coaxial spring 100 is in electrical contact with the corresponding contact pad 14 of the PCB 20. Advantageously, the orientation of the turns 102 of the coaxial spring 100 exhibit significantly lower resistance, inductance, and/or capacitance as compared with the conventional spring 18 of the prior art. While the invention is not limited to any particular modality or theory of operation, the coaxial nature of the turns 102 and the overlap thereof result in a lower number of effective turns as such relates to the parasitic inductance of the spring 100. Similarly, the capacitance is also affected by the overlapping nature of the turns 102. The resistance is significantly lower as compared with the prior art at least because the cylindrical profile of the turns 102 provides for more metallic material to carry current and increase conductivity.

Figure 10:
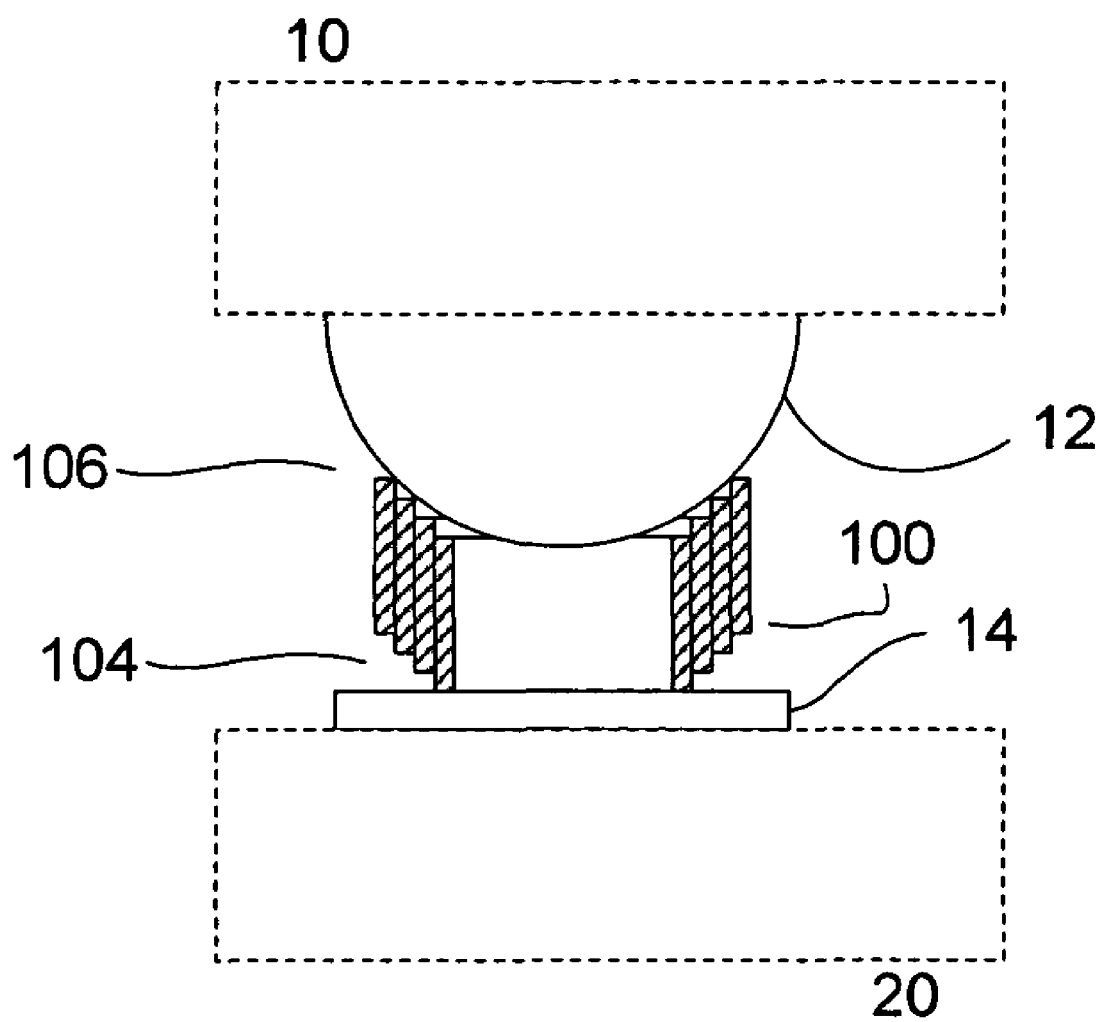
FIG. 10 is a partial side view of the apparatus of FIG. 3 employing an alternative configuration of the spring in compression.

Reference is now made to FIG. 10, which is a partial side view of the apparatus of FIG. 3 employing an alternative configuration of the spring 100. In this configuration, the first end of 104 of the coaxial spring 100 is in electrical contact with the contact pad 14 of the PCB 20, while the second end 106 of the coaxial spring 100 is in electrical contact with the corresponding ball pad 12 of the ball grid array. This configuration exhibits the advantage of providing additional contact surface connection between the second end 106 of the coaxial spring 100 and the ball pad 12 vis-à-vis the increasing diameters of the turns 102 of the spring 100. Those skilled in the art will appreciate that to achieve such surface area contact, the coaxial spring 100 must be appropriately sized and shaped as compared with the radius of the ball pad 12.

As shown in at least FIGS. 4-10, each spring may be telescopic. For instance, each spring comprises of adjacent turns that slide one within another like the tubes of a jointed telescope and are thus capable of being extended or shortened while preserving the properties of a spring.

Figure 11:
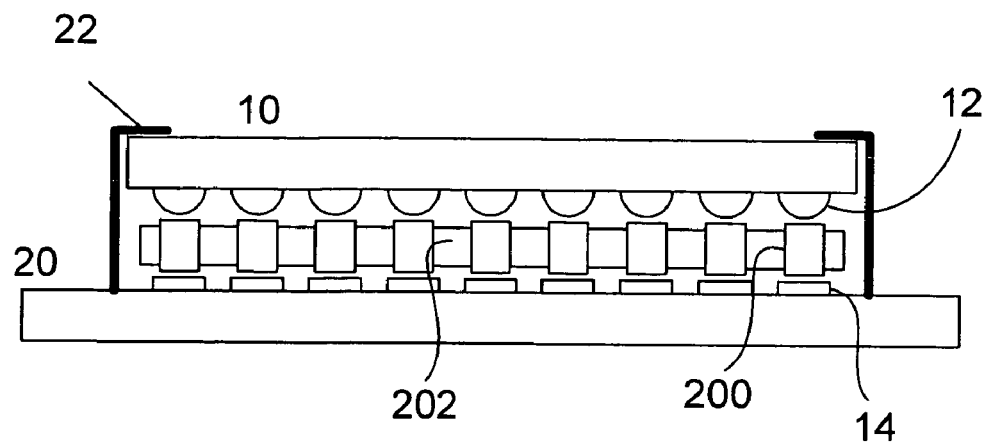
FIG. 11 is a side view of an apparatus for interconnecting a ball grid array to a PCB using a carbon nanotube connecting element in accordance with one or more embodiments of the present invention.
Figure 12:
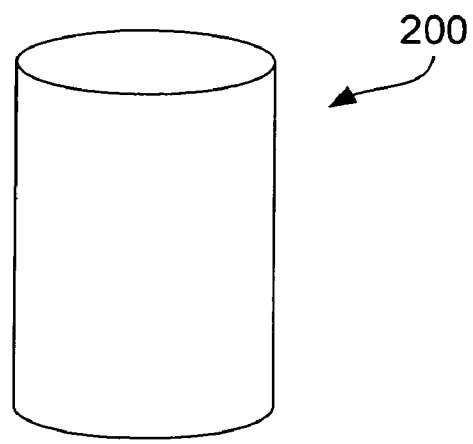
FIG. 12 is an elevational view of the connecting element of FIG. 11 that may be used for interconnecting a ball grid array to a PCB.

Reference is now made to FIG. 11, which is a side view of an apparatus for interconnecting the ball grid array of the package 10 to the contact pads 14 of the PCB utilizing an alternative connecting element 200. FIG. 12 is a side view of one of the connecting elements 200. The connecting element 200 is preferably formed from carbon nanotubes. A carbon nanotube is a cylindrical carbon molecule having a similar structure to fullerene, with one end typically being capped with half of a fullerene molecule. The connecting element 200 is preferably in the form of a cylinder, although those skilled in the art will appreciate that other configurations are within the scope of the invention, such as rectangular configurations, etc. The carbon nanotube connecting elements 200 are preferably sized and shaped to fit between, and interconnect, the respective ball pads 12 of the ball grid array and the corresponding contact pads 14 of the PCB 20. Clamps 22 are preferably provided to connect the package 10 to the PCB 20 and provide some level of compression between the ball pads 12, the connecting elements 200, and the contact pads 14.

Advantageously, carbon nanotubes are on the order of only a few nanometers wide, and provide very good thermal conduction along a longitudinal axis of the structure. Notably, the carbon nanotubes provide insulation properties laterally to the longitudinal axis. Further, the connecting element 200 exhibits very low resistance, inductance, and capacitance.

Thus, the carbon nanotube connecting element 200 does not adversely effect signaling between the package 10 and the PCB 20.

In an alternative configuration, the apparatus may include an orientation sheet 202 including a plurality of apertures that are operable to receive the connecting elements 200 and maintain same in a predetermined position. Preferably, the position maintains registration with the ball pads 12 of the package 10 and the corresponding contact pads of the PCB 20. Preferably, the orientation sheet 202 is non-conductive so that unnecessary cross-conduction between adjacent pads is avoided.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
an integrated circuit having a ball grid array;
a printed circuit board having a matrix of contact pads in registration with the ball grid array; and
a plurality of springs each having a first end in electrical contact with a ball pad of the ball grid array and a second end in electrical contact with a corresponding one of the contact pads,
wherein at least one of the springs is in the shape of a conical helix such that peripheral sides of adjacent turns thereof are in contact with and overlap one another; each of the springs has a longitudinal axis; each of the adjacent turns has a cross-section in which a height thereof, in a direction parallel to the longitudinal axis, is greater than a width thereof, in a direction perpendicular to the longitudinal axis; and a degree of the overlap of the peripheral sides along the heights thereof is a function of a compressive force such that the turns thereof tend to coaxially align when the compressive force is applied.

2. The apparatus of claim 1, wherein turns of each of the springs have larger diameters at one of the first and second ends than those at the other of the first and second ends.

3. The apparatus of claim 1, wherein adjacent turns of each spring are in contact with one another substantially along their entire lengths.

4. The apparatus of claim 1, wherein each spring is formed of a length material having a ribbon shape.

5. The apparatus of claim 4, wherein:
each spring has a longitudinal axis; and
the length of material has a cross-section in which a height thereof, in a direction parallel to the longitudinal axis, is greater that a width thereof, in a direction perpendicular to the longitudinal axis.

6. The apparatus of claim 5, wherein peripheral sides of adjacent turns of each spring are in contact with, and at least partially overlap, one another.

7. The apparatus of claim 6, wherein each spring is in a substantially collapsed position such that the peripheral sides of adjacent turns substantially overlap one another.

8. The apparatus of claim 1, further comprising a clamp operable to maintain the integrated circuit coupled to the printed circuit board such that each spring is compressed.

9. The apparatus of claim 1, further comprising conductive paste operable to couple at least one end of each spring to the corresponding ball pad or contact pad.

10. A plurality of springs for use in connecting an integrated circuit having a ball grid array to a printed circuit board having a matrix of contact pads for electrical connection to the ball grid array, the springs each having a first end for electrical contact with a ball pad of the ball grid array and a second end for electrical contact with a corresponding one of the contact pads, wherein at least one of the springs is in the shape of a conical helix such that peripheral sides of adjacent turns thereof are in contact with and overlap one another; each of the springs has a longitudinal axis; each of the adjacent turns has a cross-section in which a height thereof, in a direction parallel to the longitudinal axis, is greater than a width thereof, in a direction perpendicular to the longitudinal axis; and a degree of the overlap of the peripheral sides along the heights thereof is a function of a compressive force such that the turns thereof tend to coaxially align when the compressive force is applied.

11. The springs of claim 10, wherein turns of each of the springs have larger diameters at one of the first and second ends than those at the other of the first and second ends.

12. The springs of claim 10, wherein adjacent turns of each spring are in contact with one another substantially along their entire lengths.

13. The springs of claim 10, wherein each spring is formed of a length material having a ribbon shape.

14. The springs of claim 13, wherein:
each spring has a longitudinal axis; and
the length of material has a cross-section in which a height thereof, in a direction parallel to the longitudinal axis, is greater that a width thereof, in a direction perpendicular to the longitudinal axis.

15. The springs of claim 14, wherein peripheral sides of adjacent turns of each spring are in contact with, and at least partially overlap, one another.

16. The springs of claim 14, wherein each spring is in a substantially collapsed position such that the peripheral sides of adjacent turns substantially overlap one another.

17. An apparatus, comprising:
an integrated circuit having a ball grid array;
a printed circuit board having a matrix of contact pads in registration with the ball grid array; and
a plurality of connection elements formed from carbon nanotubes, each connection element having a first end in electrical contact with a ball pad of the ball grid array and a second end in electrical contact with a corresponding one of the contact pads.

18. The apparatus of claim 17, wherein at least one of the first end and the second end of each the connection elements are connected to the ball pad and/or the contact pad by means of conductive paste.

19. The apparatus of claim 17, further comprising a clamp operable to maintain the integrated circuit coupled to the printed circuit board such that each connection element is in compression.

20. The apparatus of claim 17, further comprising an orientation sheet of a non-conductive material, the sheet including a plurality of apertures for receiving the connection elements and maintaining same in a predetermined position and in registration with the ball pads and the contact pads.

21. The apparatus of claim 17, wherein the connection elements are in the form of a cylinder.

22. A plurality of connection elements being sized and shaped to connect an integrated circuit having a ball grid array to a printed circuit board having a matrix of contact pads for electrical connection to the ball grid array, the connection element being formed from carbon nanotubes and having a first end adapted to be in electrical contact with a ball pad of the ball grid array and a second end adapted to be in electrical contact with a contact pad.

23. The apparatus of claim 1, wherein the first end of the at least one spring contacts one of the ball pads of the ball grid array over a surface area thereof, the surface area increasing as a function of an increase in the compressive force on the at least one spring.

24. The apparatus of claim 23, wherein:
the surface area of contact is established by one or more edges of respective ones of the turns of the at least one spring that contact the ball pad of the ball grid array; and
a number of the edges of the turns that contact the ball pad increases as a function of the increasing compressive force on the at least one spring.

25. An apparatus, comprising:
an integrated circuit having a ball grid array;
a printed circuit board having a matrix of contact pads in registration with the ball grid array; and
a plurality of springs each having a first end in electrical contact with a ball pad of the ball grid array and a second end in electrical contact with a corresponding one of the contact pads,
wherein at least one of the springs is telescopic.

26. The apparatus of claim 25, wherein each spring is formed of a length material having a ribbon shape.

27. The apparatus of claim 26, wherein:
each spring has a longitudinal axis; and
the length of material has a cross-section in which a height thereof, in a direction parallel to the longitudinal axis, is greater that a width thereof, in a direction perpendicular to the longitudinal axis.

28. The apparatus of claim 25, further comprising a clamp operable to maintain the integrated circuit coupled to the printed circuit board such that each spring is compressed.

29. The apparatus of claim 25, further comprising conductive paste operable to couple at least one end of each spring to the corresponding ball pad or contact pad.

* * * * *